United States Patent [19]

Murayama et al.

[11] Patent Number: 4,825,555
[45] Date of Patent: May 2, 1989

[54] APPARATUS FOR AUTOMATIC FORMING ON A FILM MATERIAL OF BOTH A MASK FILM PATTERN AND A POSITIONING HOLE

[75] Inventors: Minoru Murayama, Shiga; Takaharu Yamamoto; Takeji Hashimoto, both of Kyoto, all of Japan

[73] Assignee: Dainippon Screen Mfg. Co., Ltd., Japan

[21] Appl. No.: 114,664

[22] Filed: Oct. 29, 1987

[30] Foreign Application Priority Data

Oct. 31, 1986 [JP] Japan ................. 61-261521

[51] Int. Cl.⁴ ............................................. B43L 13/00
[52] U.S. Cl. ..................................... 33/1 M; 33/18.1; 33/503; 33/666; 33/579
[58] Field of Search ...................... 33/18.1, 32.1, 32.3, 33/503, 1 M, 505, 504, 666, 679, 574, 579

[56] References Cited

U.S. PATENT DOCUMENTS

| | | | |
|---|---|---|---|
| 3,158,936 | 12/1964 | Virta | 33/18.1 |
| 3,339,279 | 9/1967 | Sovar et al. | 33/18.1 X |
| 3,519,905 | 7/1970 | Little et al. | 33/18.1 X |
| 3,753,384 | 8/1973 | Anfindsen | 33/18.1 |
| 4,324,047 | 4/1982 | Roeh | 33/18.1 |
| 4,512,079 | 4/1985 | LeBlond | 33/1 M |
| 4,635,365 | 1/1987 | Hashimoto et al. | |
| 4,709,483 | 12/1987 | Hembree et al. | 33/18.1 |

Primary Examiner—William D. Martin, Jr.
Attorney, Agent, or Firm—Ostrolenk, Faber, Gerb & Soffen

[57] ABSTRACT

An automatic mask cutting/drawing apparatus for preparing a mask film and for forming both positioning holes and a desired image mask pattern or a drawing of a desired line image includes a table for supporting a film material thereon, a first carriage movable along the table surface in a first direction, a second carriage movable on the first carriage in a second direction, first and second moving elements for respectively moving the first and second carriages in their respective directions, a vertically movable drawing element on the second carriage for drawing a desired image pattern on the film material, and a vertically movable cutter element adjacent the drawing element for cutting the film material. Both the drawing element and the cutter element are selectively activatable to form the positioning holes, the image mask pattern, or the drawing as desired and in accordance with commands which are inputted to the apparatus.

26 Claims, 7 Drawing Sheets

APPARATUS FOR AUTOMATIC FORMING ON A FILM MATERIAL OF BOTH A MASK FILM PATTERN AND A POSITIONING HOLE

BACKGROUND OF THE INVENTION

The present invention relates generally to an apparatus for automatically providing positioning holes on a film material, and more particularly to an apparatus with a cutter unit for making a mask film and for forming positioning holes on a film material while moving the cutter unit in X- and Y-directions thereon.

It is well known to use a so-called "pin-and-punch system" in a pre-process. In the "pin-and-punch system", a pair of registering pins are provided at a predetermined position e.g. on an original holder of a process camera, where a film material, e.g. mask film having a desired opaque mask pattern, is mounted together with an original to be masked. On the other hand, a pair of positioning holes engagable with the registering pins are provided on both the film material and on the original. With this the film material is precisely positioned on the original holder of the process camera, so that an undesired image of the original is masked by the mask film so that only a desired image thereof is exposed.

For providing such positioning holes on a film material, several types of punching devices are supplied to the market. One such conventional punching devices is shown in U.S. Pat. No. 4,635,365 issued to Hashimoto et al.

Indeed the Hashimoto et al patent has an advantage that it can be used in preparing positioning holes on a film material for a specific standard of the pin-and-punch system, but it is necessary to change a punching device when using a different standard of a pin-and-punch system.

In fact, several manufacturers adopt different standards in respect of such pin-and-punch systems, particularly as concerns the length between positioning holes and the diameter thereof. The manufacturers supply to the market their apparatus which meets only their own standards. Consequently it is inconvenient for a large number of users to purchase and furnish the necessary number of punching devices and adapt them for different standards which pertain to different manufacturers.

Moreover, the Hashimoto et al patent is suitable for preparing of relatively small sized film materials, where only one pair of positioning holes may ordinarily be provided and only along one edge of the film material. So long as its use is for such purpose, the Hashimoto et al patent may be sufficiently useful. But it is very difficult and troublesome, though not impossible, to provide positioning holes on a relatively large sized film material, where it is often necessary to provide positioning holes along all four edges of the film material.

SUMMARY OF THE INVENTION

Accordingly, it is a principal object of the present invention to provide a novel apparatus for use in preparation of positioning holes on a film material, independently of the standards of a particular pin-and-punch system.

It is another object of the invention to provide an apparatus for making a positioning hole on a film material of any size which is capable of providing positioning holes along two or more edges of a film material.

It is a further object of the invention to provide a novel apparatus which can be used for both preparing a maask film for use in masking an undesired image on an original so as to expose only a desired image and providing positioning holes on the mask film.

The aforementioned objects are realized by the present invention, with an apparatus which includes a table for receiving a film material thereon, a first carriage movable along the table surface in a first direction; a second carriage movable along the first carriage in a second direction, first and second moving means for respectively moving the first and second carriages in respective directions, and cutter means provided on the second carriage for cutting the film material to form both a desired mask film and a desired positioning hole at a desired position on the film material. The cutter means is movable in the vertical direction relative to the film material and is controllable to reach two different cutting depths in the film material.

Preferably, the apparatus further comprises memory means for storing image pattern data including those concerning the positioning hole and those concerning a desired mask image pattern, and processing means for processing said image data and controlling the movements of the first and the second carriages in the first and the second directions and the cutter means in the vertical direction relative to the film material.

In case of preparation of both the positioning holes and the mask film, the film material comprises an opaque layer for masking an undesired image and a transparent base layer for allowing a desired image pattern to be exposed.

The image pattern data concerning the positioning hole includes a discrimination command for cutting both the opaque and transparent layers, coordinate values of the positioning hole and a function command for representing a cutting figure, e.g. line, arc, ellipse, circle or the like.

The image pattern data concerning the desired mask image pattern includes a discrimination command for cutting only the opaque layer of a desired mask image pattern, coordinate values of the desired mask image pattern and a function command for representing a cutting figure, e.g. line, arc, ellipse, circle or the like.

Preferably, the apparatus further comprises drawing means provided adjacent to said cutter means for drawing a desired image pattern on the film material. When using the drawing means, the film material comprises a drawing sheet adaptable for drawing a desired image pattern with the drawing means.

According to a preferred embodiment of the present invention, the apparatus is equipped with both the drawing means and the cutter means for the purposes of image drawing and mask cutting, which are alternatively used to carry out either one of the purposes.

It is preferable that the cutter means comprises a cutter blade for cutting the film material, a supporting member for holding said cutter blade at the lowermost part thereof, rotation means for rotating said supporting member so as to turn the cutter blade to a desired cutting direction, and moving means for moving said cutter blade in the vertical direction relative to the film material. The moving means are controllable so that the cutter blade reaches different cutting depths in the film material.

In accordance with a preferred embodiment, the moving means comprises biasing means provided on the supporting member for biasing the supporting member upward so as to raise the cutter blade from the film material, and linear motor means for moving the cutter blade downward to different cutting depths in response to electrical signals applied thereto.

With the aforementioned features, the present invention has the following useful advantages:

The apparatus according to the present invention makes it possible to prepare the positioning holes at a desired position on the film material, independently of the particular standards of the pin-and-punch system.

The apparatus can be used for purposes of both preparing a mask film and for making positioning holes and is adaptable for any different standards of pin-and-punch systems.

The apparatus can also be used as an automatic drawing apparatus for drawing a desired image pattern on a drawing sheet material.

Other novel features and advantages of the present invention will become apparent in the course of the following detailed description taken together with the accompanying drawings, which are intended only to facilitate understanding of the present invention and without restricting the scope thereof.

DETAILED DESCRIPTION OF THE PREFERRED EMBODIMENTS

Figure 9:
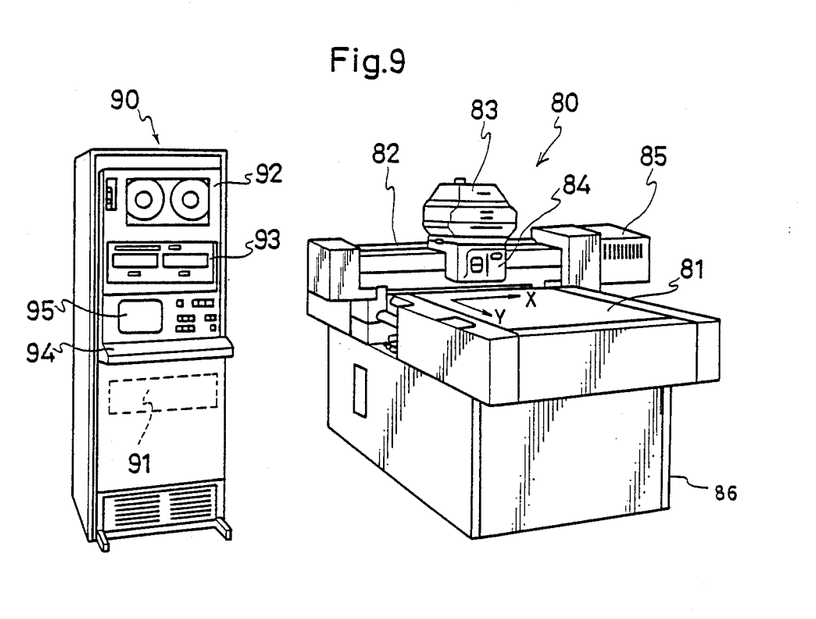
FIG. 9 is a perspective view of an apparatus to which the cutter unit is mounted.

FIG. 9 shows an outline of an apparatus according to the present invention. The apparatus generally comprises a work unit 80 and a console unit 90. The console unit 90 includes a magnetic tape device 92, a floppy disc device 93, a keyboard 94 provided with a number of function keys, preferably ten keys, a monitoring unit 95 and a computer unit 91. Image information concerning cutting or drawing and control instructions are stored either in the magnetic tape or in a floppy disc, in the form of digital signals. Additional control instructions for work unit 80 are inputted through the keyboard. The computer unit 91 provided in the console unit 90 processes the image information on the basis of the control instructions, to output necessary control signals to work unit 80.

Selection of whether the magnetic tape or the floppy disc should be used is determined on the basis of quantity of information to be stored. That is, when a large quantity of mask information and control instruction is to be stored, the magnetic tape is selected. When a relatively small quantity of data, e.g. to less than about one megabyte, is to be stored, the floppy disc is selected.

The work unit 80 is electrically connected with the console unit 90 and is controlled by the output signals from computer unit 91.

The work unit 80 comprises a base frame 86, a drawing/cutting table 81 on the base frame, a first carriage 82 slidably movable along the table surface in the Y-direction, a second carriage 83 slidably movable along the first carriage in the X-direction, and a receiving station 84 to which both a cutter unit 10 and a drawing pen holder 101 are mounted.

The carriages 82 and 83 are driven by motors (not shown) contained within the table 81 and a housing 85, respectively. The motors are controlled by the signals outputted from computer unit 91, by which the receiving station 84 is moved in the X- and Y-directions, so that a desired image pattern is traced on the film material either by a cutter blade on the cutter unit 10 or by a drawing pen held by the drawing pen holder 101.

The table 81 includes suction elements (not shown) for fixedly holding film material, e.g. a drafting paper, a mask film or the like, on the upper surface thereof.

A rotary encoder (not shown) is coupled to the motors which drive carriages 82 and 83, through which the travel amount of the carriages in the X- and Y-directions is measured and output to computer unit 91.

Figure 10:
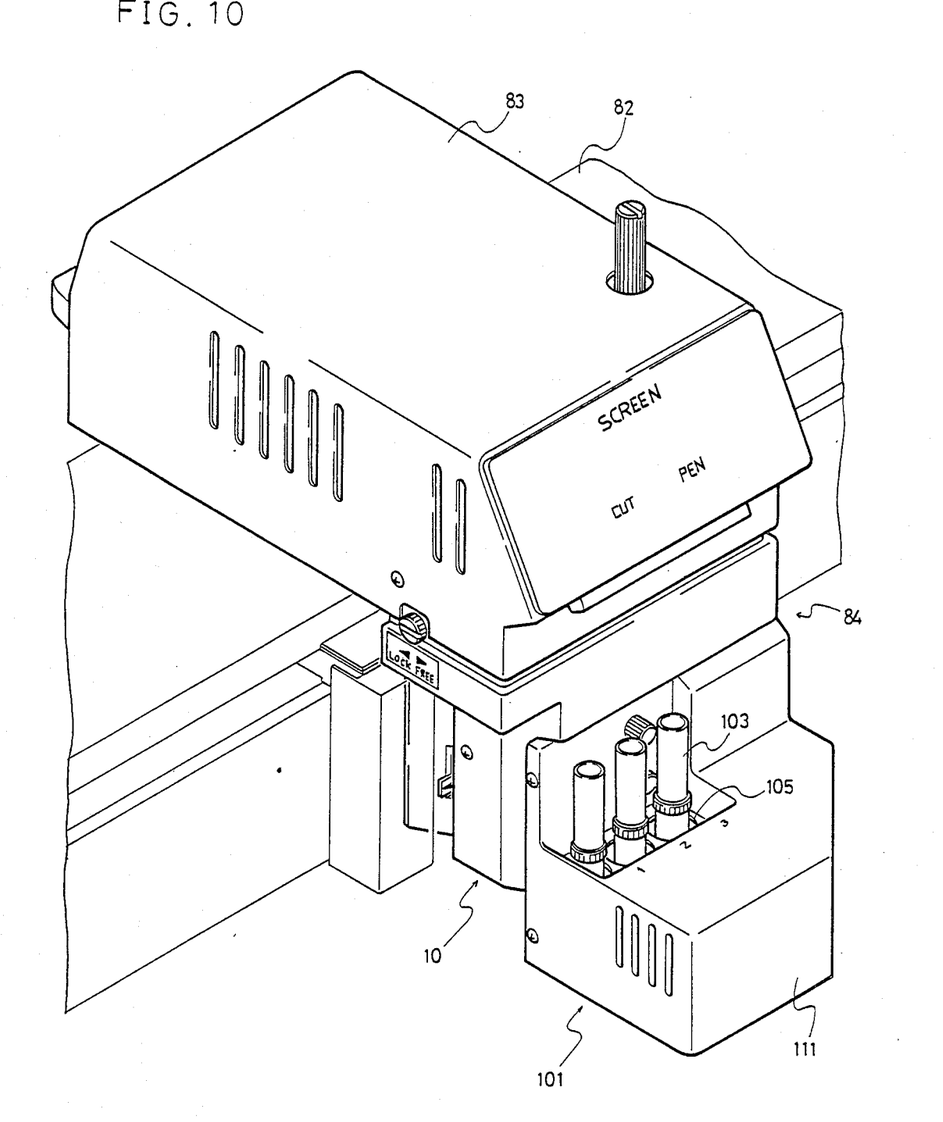
FIG. 10 is an enlarged perspective view showing an outline of a cutter unit and a drawing drawing unit.

FIG. 10 shows an enlarged perspective view of the cutter unit 10 and the drawing unit 101. Both the cutter unit and the drawing unit are fixedly mounted to receiving station 84 of second carriage 83. The cutter unit 10 has a cutter blade at the lower-most part thereof, and the drawing unit 101 has drawing pens mounted thereon. Both the cutter blade and drawing pens are movable in the vertical direction relative to the upper surface of the film material, as described more fully below.

Figure 1:
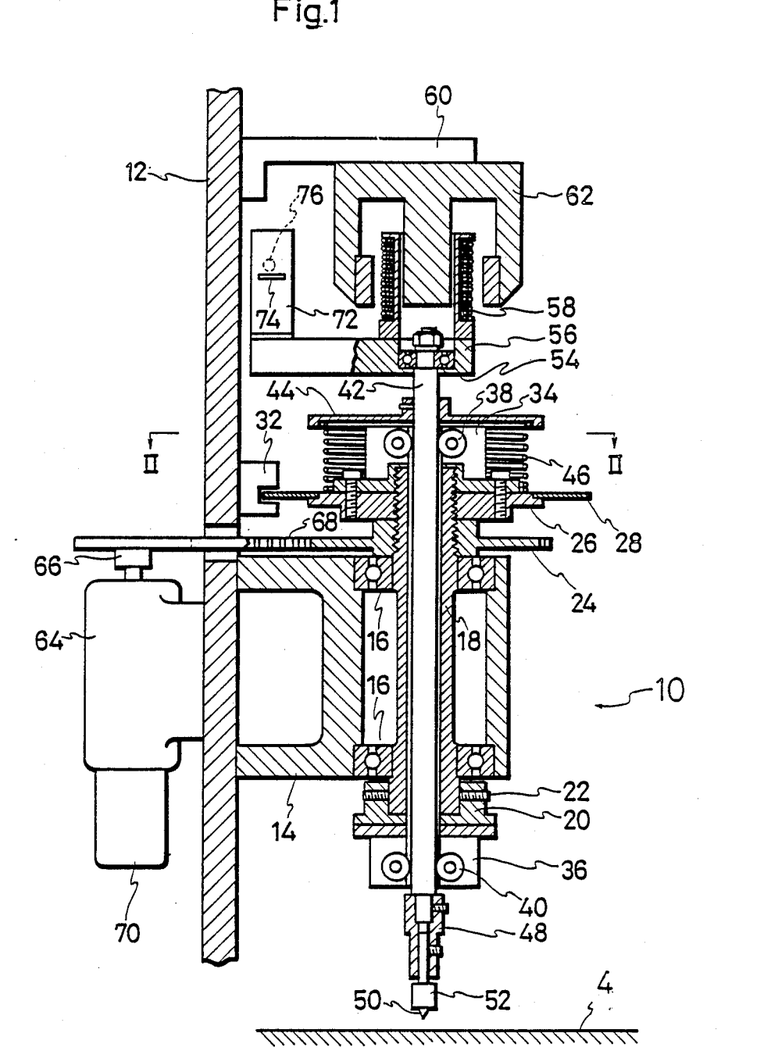
FIG. 1 is a vertical sectional view of a cutter unit.
Figure 2:
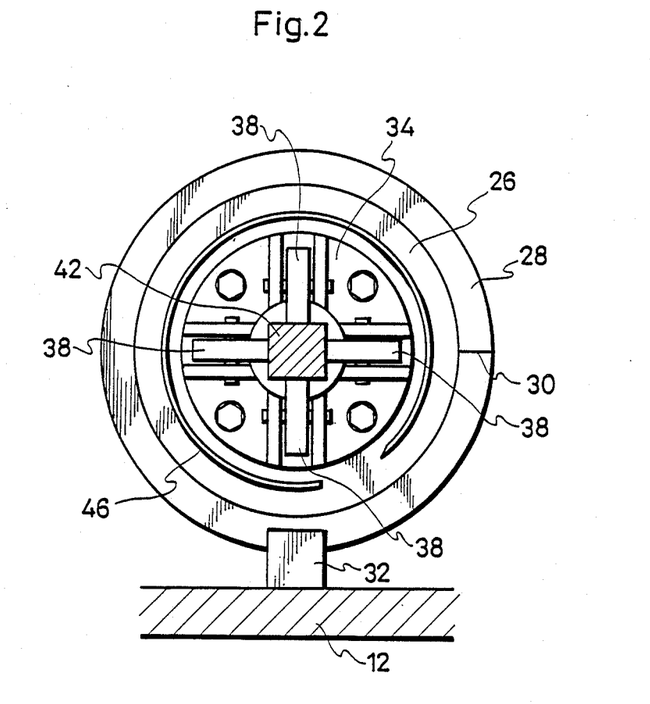
FIG. 2 is a fragmentary sectional view along the line II—II of FIG. 1.
Figure 11:
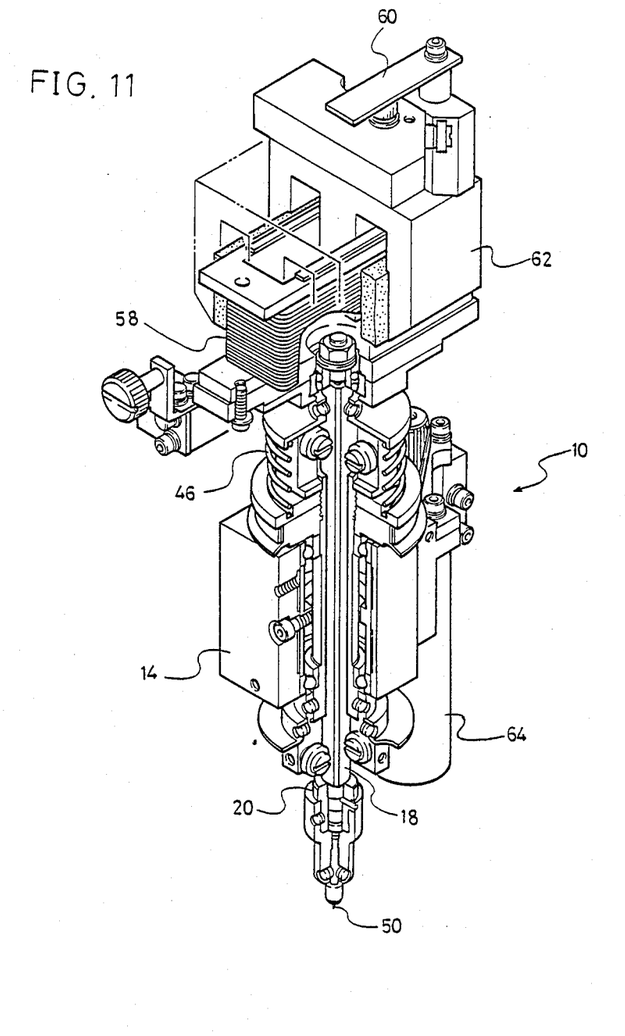
FIG. 11 is a fragmentary perspective view showing the cutter unit in more detail.

Referring simultaneously to FIGS. 1, 2 and 11 which show the structure of cutter unit 10 in greater detail, a mask film 4 is fixedly mounted on table 81 by a suction element. The cutter unit 10 is mounted to travel along the X- and Y-directions by means of carriages 82 and 83.

Specifically, cutter unit 10 is mounted on the receiving station 84 which includes a supporting member 12. A drawing unit 101 is mounted adjacent cutter unit 10 for carrying different drawing pens, e.g. a hollow pen, a ball point pen, a scriber or the like, for different purposes. For clarity, the drawing unit 101 is omitted in FIGS. 1 and 2.

The supporting member 12 is provided with a bracket 14 having bearings 16 with which a hollow shaft 18 is rotatably supported. The hollow shaft 18 has a flange 20 fixed to its lower end portion by means of screws 22, and has a gear 24 and a disc 26 at its upper end portion, which function as a double nut. The disc 26 and flange 20 define the displacement of the hollow shaft 18 with respect to the bracket 14.

The disc 26 is provided with a ring-shaped index rotor 28 at its periphery, for measuring an origin for controlling the rotation of hollow shaft 18. The index rotor 28 has an index line 30 drawn thereon, typically as shown in FIG. 2. When the index line 30 passes through a detector 32 fixed to the supporting member 12, it is sensed so that a starting point is determined for counting the number of pulses outputted from a rotary encoder 70 attached to a motor 64 for rotating the hollow shaft 18.

The reference numerals 34 and 36 denote an upper bearing and a lower bearing fixed to the disc 26 and the flange 20, respectively. As shown in FIG. 2, the upper bearing 34 is provided with four roller carriers in a cross-like state on which rollers 38 are carried. Likewise the lower bearing 38 is provided with rollers 40 in the same manner. The rollers 38 and 40 support a main shaft 42 extending through the hollow shaft 18 in such a manner as to be vertically movable along the inside wall thereof and rotatable in accordance with the rotation thereof.

A spring 46 is provided between disc plates 44 and 26 in such a manner as to bias the main shaft 42 and the disc plate 44 upward. The main shaft 42 is provided with a cutter holder 52 having a cutter blade 50 through a socket 48 at its lower terminating end, and is rotatably connected to a plate member 56 through a bearing 54, which the plate member is caused to move up and down in the manner described above. Preferably the bearing 54 comprises a self-aligning type.

The plate member 56 is provided with an actuator 58, which is opposed to a core 62 fixed to a bracket 60 projecting from the supporting member 12. In response to an applied voltage actuator 58 is biased downward, the biasing power being controlled by adjusting the applied voltage. The assembly which includes the core 62 and actuator 58 will be referred to hereinafter as a linear motor.

The motor 64 for rotating the cutter blade is provided on supporting member 12, and its driving shaft has a gear 66, to which the gear 24 of the hollow shaft 18 is connected through a timing belt 68. In this manner, hollow shaft 18 and, hence, main shaft 42 are rotated by motor 64 through the timing belt.

As has been mentioned, motor 64 is provided with the rotary encoder 70, the latter outputting a quantity of pulses the number of which varies in proportion to the rotation of encoder 70 so as to control the rotation of motor 64 by reference to the starting point which is detected via index line 30 on index rotor 28 as it passes through detector 32. In this way, the cutter blade 50 may be manipulated as desired.

The plate member 56 is provided with a position detecting device for detecting the position assumed by main shaft 42 relative to mask film 4 so as to control the speed at which main shaft 42 descends. The position detecting device comprises a slitted plate 72 having a slit 74 extending upward from plate member 56, and a slit detector formed of a light source and an optical receiver 76. The slit 74 is located so as to come into alignment with the optical axis of the light source and receiver 76 when the cutter blade descends up to a point immediately above the mask film 4 on the table. In this case, the position detecting device outputs a signal, thereby slowing down the downward speed of cutter blade 50. This allows the cutter blade 50 to come into contact with the mask film 4 at a safe speed. Until it is slowed, cutter blade 50 descends at a relatively high speed by applying a higher voltage to core 62, since, if the cutter blade 50 were to descend the distance entire at the slower speed, the operation would take too long and be inefficient.

Figure 3:
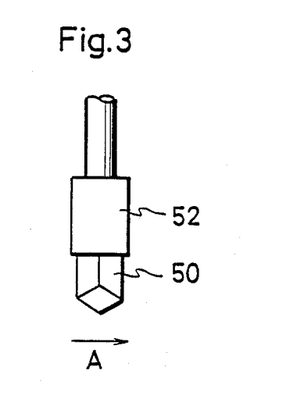
FIGS. 3 and 4, respectively, are an elevational view and a side view, showing a cutter blade mounted to the cutter unit.
Figure 4:
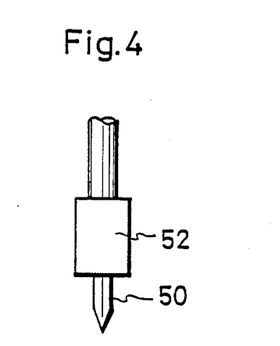

The cutter blade 50 is made of a hard material such as diamond, and is shaped as shown in FIGS. 3 and 4, wherein FIG. 3 shows a front view in the moving direction A, and FIG. 4 shows a side view thereof. When the mask film 4 is placed on the table, a cutting mat preferably of soft vinyle chloride (not shown) is preferably placed under the mask film to prevent the cutter blade 50 from cutting the surface of the table. The mask film is fastened to the cutting mat by means of an appropriate measure, e.g. a suction element or an adhesive tape.

Which type of cutter blade 50 and drawing pen is to be used is determined by instructions inputted through keyboard 94. That is, if an image pattern drawing such as a block copy is to be prepared, instructions for an image pattern drawing are inputted through the key board 94, and a drawing pen is actuated for drawing a desired image pattern on the basis of the image information stored either in the magnetic tape or in the disc floppy. If a mask cutting for a mask film is desired, instructions for mask cutting are inputted through the key board, and in response to the instructions the cutter unit is actuated for cutting a desired mask pattern thereon.

Figure 12:
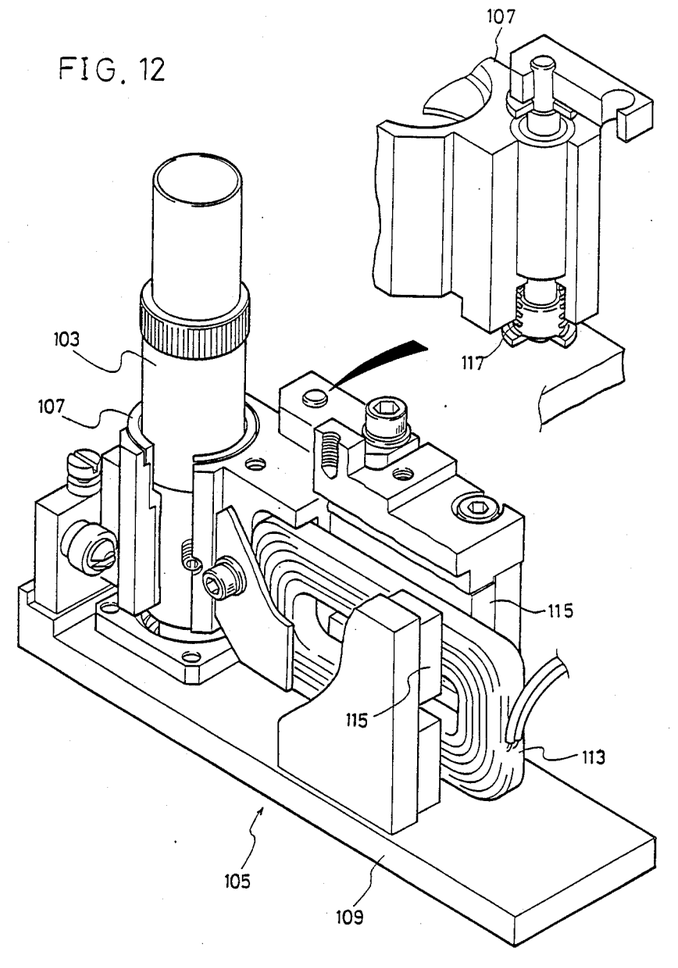
FIG. 12 is a fragmentary perspective view showing a part of the drawing unit.

Referring to FIGS. 10 and 12 for a more detailed view of the drawing unit 101, the drawing unit 101 is seen to be mounted in front of cutter unit 10 and includes three pen stations 105, in which desired drawing pens 103 are mounted as necessary.

Each pen station 105 comprises a housing 111, bracket 109 fixedly mounted in the housing, a holder 107 movably provided on the bracket for holding a drawing pen 103 vertically thereon and a linear motor having substantially the same structure as the linear motor of the cutter unit.

The linear motor comprises an actuator 113 and an oppositely disposed core 115. As in cutter unit 10, actuator 113 is urged downward by the applicator of a voltage the urging power being controlled by adjusting the applied voltage.

The holder 107 is normally biased upward by means of a spring 117 to raise a drawing pen 103 from a film material when it rests.

Figure 5:
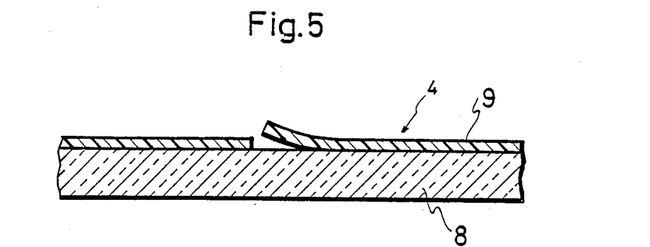
FIGS. 5 and 6 are a fragmentary sectional view, respectively, showing the preparation of a mask film.
Figure 6:
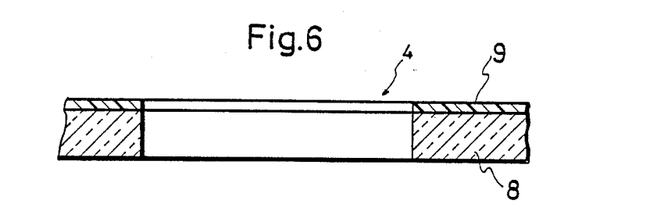

Referring to FIGS. 5 and 6, mask film 4 comprises an opaque peeling layer 9 atop a transparent substratum 8 and the peeling layer being cut and peeled away in accordance with a desired image pattern. Such a mask film is commercially available from Dainippon Screen Mfg. Co., Ltd. and is known by its trademark "CAD-PEEL".

When cutting a desired mask image pattern, the cutter blade 50 may penetrate slightly into the substratum 8 beyond the opaque peeling layer 50, as shown in FIG. 5. FIG. 6 shows the mask film 4 with a positioning hole for fitting a registering pin therein. To form a positioning hole, the depth of the cut is is increased by increasing the voltage applied to the linear motor. More particularly, when only the opaque peeling layer of a desired image pattern is cut out of the mask film, the voltage is relatively low, thereby causing the cutter blade 50 to touch the mask film softly to cut only the peeling layer 9, hardly penetrating the transparent substratum 8. However, when the positioning hole is to be made, a relatively high voltage is impressed on the linear motor to cause cutter blade 50 to penetrate deeply and through the substratum 8. The positioning holes can thus be formed after or during the cutting of the desired image patterns in the peeling layer.

The applied voltage is empirically determined in and is set accordance with the characteristics of the linear motor, the weight of the cutter unit, the strength of the biasing spring 46 and the quality of the mask film so as to secure an adequate pressure with which cutter blade 50 shall press upon the mask film. An experiment has demonstrated that, for cutting only peeling layer 9 a pressure of 20 gf is adequate and for cutting both the substratum 8 and peeling layer 9, a pressure in the range from 120 to 300 gf is adequate.

Control of the depth of cut may, of course, be done by adjusting the current applied either to the linear motor of the cutting unit or to that of the drawing unit. Preferably, the control is done by adjusting both the voltage and the current applied thereto.

In operation, cutter unit 10 is moved so as to enable the cutter blade 50 to follow the outline of the desired image pattern, during which the cutter blade 50 is rotated in a direction corresponding to a moving direction of the cutter unit 10 by controlling the motor 64.

When the peeling layer of the desired mask pattern is cut out of the mask film, adjustment of both voltage and amperage is effected to the linear motor so that the cutter blade 50 penetrates only the peeling layer 9 and not the substratum 8. When the positioning holes are made for the registering pins, a high voltage is applied so as to enable the cutter blade 50 to penetrate the substratum 8 as well. After all the desired cuts are made, the peeling layer of the desired mask pattern whose outline was cut is removed therefrom, thereby allowing the substratum 8 in the image pattern area to expose itself as shown in FIG. 6. In this manner, a desired mask film having the positioning holes and the desired mask pattern is obtained. Both the mask pattern and the positioning holes are cut by the same cutter blade 50 of the same apparatus and by a single process, through adjusting the voltage and/or amperage applied to the linear motor. This provides a more precise relative positioning between the desired mask patterns and positioning holes on the mask film, and accordingly, when the mask film is superposed on an original to be masked, the precise positioning relative to the original is assured.

Next, operations for obtaining a desired mask film will be discussed below. First, a block copy or negative film is placed on an appropriate coordinate apparatus or simply a digitizer, e.g. a "Backlighting Digitizer FG-II BL" manufactured by Dainippon Screen Mfg. Co., Ltd., by which the desired image pattern information is obtained and stored either in the magnetic tape or in the floppy disc as necessary.

The image pattern information defines both the positioning holes and the mask image pattern. When the image pattern information on the positioning holes is inputted, a "positioning hole cutting command" is inputted, and then coordinate values of the desired positioning holes are measured on the digitizer, and function commands for desired positioning holes, which represent line, arc, ellipse, circle, or the like, are selected from a menu table. These commands and coordinate values are stored either in the magnetic tape or in the floppy disc.

When the inputted image pattern information concerns mask image patterns, a "cut-mask command" is inputted. Then coordinate values of the desired mask image pattern of the block copy or negative film are measured on the digitizer, and function commands as mentioned above are selected. These commands and coordinate values are also stored either in the magnetic tape or in the floppy disc.

Next, a film material, e.g. the "CADPEEL" mask film or drawing sheet, is placed on the work table 81, and is fixedly held thereon by means of suction elements. The aforementioned image pattern data are then processed by the computer unit 91 of the console unit 90. In response to the "positioning hole command", the computer unit 91 outputs a control signal for controlling an offset pressue of the cutter unit 10 against the film material 4. As mentioned above, the offset pressure is controlled, e.g. at 200 gf. While, in response to the "mask-cut command", the computer unit outputs a control signal for controlling an offset pressure of the cutter blade, e.g. at 20 gf.

Further, in response to the coordinate values and the function commands, the computer unit 91 outputs control signals for controlling the movement direction of cutter blade 50 on the cutter unit as well as the movement of the cutter unit in the X- and Y-directions.

Figure 7:
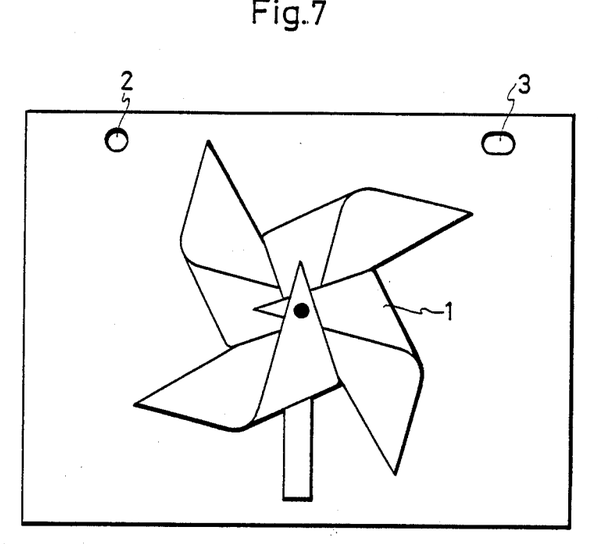
FIG. 7 is a plane view of an original to be masked.
Figure 8:
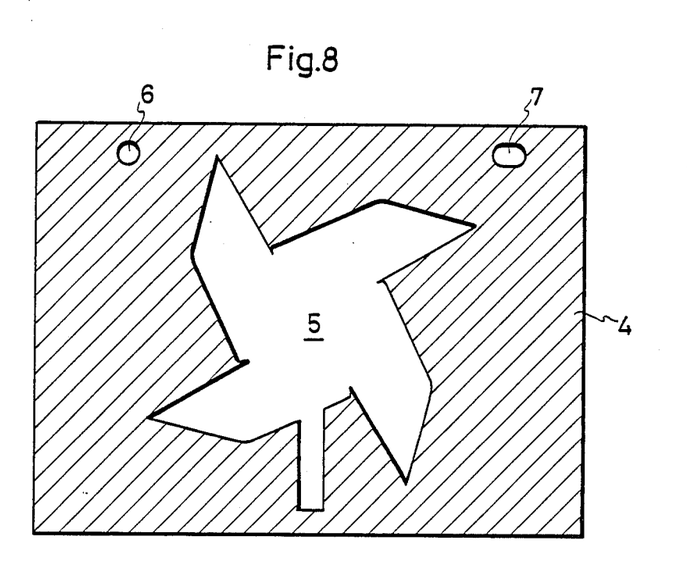
FIG. 8 is a plan view of a mask film to be superposed on the original.

As above, the desired positioning holes and mask image patterns are cut by means of the cutter blade. An operator removes the material from the positioning holes and peels the opaque layer corresponding to the desired image pattern, whereby a desired mask film as shown in FIG. 8 is obtained. In FIG. 8, the hatched area is opaque and serves to mask undesired images of an original. The area 5 is transparent and represents the area from which the opaque layer has been peeled from the film material. The transparent area precisely corresponds to the outer contour of the desired image to be exposed as shown in FIG. 7, through which only the desired image is exposed on a photosensitive material, e.g. placed on a focal plane of a process camera.

A reference numerals 6 and 7 denote the aforementioned positioning holes having a different shape from each other, where both the opaque layer and the transparent layer are removed to fit the registering pins thereinto. The left positioning hole 6 is formed as a circle which precisely corresponding to the shape of the corresponding registering pin. The right positioning pin 7 is slot shaped and extends along the adjacent edge of the film material, by which fitting of the corresponding registering pin thereinto is easily carried out.

Quite obviously the positioning holes can be formed at any position on the film material and, therefore, the invention usable with all pin-and-punch systems.

When using the mask film thus obtained, first an original to be reproduced is positioned, e.g. on an original holder of a process camera, by fitting the registering pins fixed on the holder into the positioning holes provided on the original. One can use "CP-COLOR" model CP-4850 supplied from Mitsubishi Paper Mills Ltd. as such a process camera as mentioned above.

Then, the mask film thus obtained is superposed onto the original by fitting the registering pins into the positioning holes thereof identically as described above. Both the original and the mask film are closely pressed against the original holder, e.g. by a transparent pressure plate, by which only the desired image 1 on the original is reproduced on a photosensitive material placed on the focal plane of the camera.

Next, drawing a desired image pattern on a film material is discussed below. First, an original or a rough sketch of a desired image is placed on a digitizer. An operator inputs desired coordinate values of the image and appropriate function commands which represent appropriate line figures, e.g. line, arc, ellipse, circle or the like, by simulating the image on an appropriate monitoring device. Selection commands for designating an appropriate drawing pen from among those held on the drawing unit are also inputted in accordance with a purpose of line drawing. The image pattern data thus inputted is stored either in the magnetic tape or in the floppy disc.

Next, an appropriate drawing sheet is placed on the work table 81, which is fixedly held thereon by means of a suction element. The aforementioned image pattern data are processed by the computer unit 91 of the console unit 90. In response to the selection command, the computer unit outputs a designating signal for designating an appropriate drawing pen and a control signal for controlling an offset pressure and travelling speed in X- and Y-directions adaptable for thus designated drawing pen.

On the basis of the output signals, the drawing pen is controlled, to draw a desired image on the drawing sheet.

Although the discussion of the drawing unit 105 and its operations regarding the drawing of a desired image pattern are not given in detail, discussions on the cutter unit and operations for cutting a desired image pattern are generally applicable to those as long as appropriate. Accordingly, a person skilled in the art can easily understand how to make and use the apparatus according to the invention.

Although the present invention has been described in relation to particular embodiments thereof, many other variations and modifications and other uses will become apparent to those skilled in the art. It is preferred, therefore, that the present invention be limited not by the specific disclosure herein, but only by the appended claims.

We claim:

1. An apparatus for automatically forming both a mask film pattern and a positioning hole on a film material, the apparatus comprising:
   a table having a table surface for supporting thereon the film material;
   a first carriage movable along the table surface in a first direction;
   a second carriage mounted on and movable along the first carriage in a second direction;
   first and second moving means for respectively moving the first and second carriages in the first and second directions, respectively;
   cutter means on the second carriage for cutting the film material when film material is located on the table surface to form both a desired mask film and a positioning hole at a desired position on the film material; and
   third moving means for moving said cutter means in a direction generally perpendicular to the surface of the film material and control means for selectively cutting the film material at first and second different cutting depths to respectively form said mask film pattern and said positioning hole.

2. An apparatus as set forth in claim 1, further comprising memory means for storing image data including data relevant to said positioning hole and data relevant to said mask image pattern; and processing means for processing said image data and controlling the movements of the first and the second carriages in the first and the second directions and the movement and position of said cutter means in the vertical direction relative to the film material.

3. An apparatus as set forth in claim 1, wherein said film material comprises an opaque layer for masking an undesired image and a transparent base layer for enabling a desired image pattern to be exposed therethrough.

4. An apparatus as set forth in claim 2 or 3, wherein the image data for the positioning hole includes a discrimination command for cutting both the opaque and transparent layers, coordinate values defining the location of the positioning hole and a function command for defining the shape of the positioning hole.

5. An apparatus as set forth in claim 2 or 3, wherein the image data for the mask image pattern includes a discrimination command for directing the cutter means to cut only the opaque layer of desired mask image pattern, coordinate values for defining the boundaries of the mask image pattern and a function command.

6. An apparatus as set forth in claim 1, further comprising drawing means located on said second carriage adjacent to said cutter means for drawing a desired image pattern on the film material.

7. An apparatus as set forth in claim 6, wherein said film material comprises a drawing sheet suitable for drawing the desired image pattern thereon with said drawing means.

8. An apparatus as set forth in claim 6, wherein said control means are effective for selectively actuating said drawing means and said cutter means to carry out either image drawing or mask cutting.

9. An apparatus as set forth in claim 1, wherein said cutter means comprises:
   a cutter blade for cutting the film material;
   a supporting member for holding said cutter blade at a lowermost part thereof;
   rotation means for rotating said supporting member so as to turn the cutter blade to a desired cutting direction; and
   said third moving means being effective for moving said cutter blade in the vertical direction relative to the film material, said third moving means being controllable so that the cutter blade is positionable to said first and second cutting depths in the film material.

10. An apparatus as set forth in claim 9, wherein said third moving means comprises:
   biasing means on said supporting member for biasing the supporting member upward to raise the cutter blade above the film material; and
   linear motor means for moving the cutter blade downward to said first or second cutting depths in response to electrical power applied thereto.

11. An apparatus as set forth in claim 10, wherein said linear motor means is controllable in accordance with the magnitude of electrical power applied thereto.

12. An apparatus as set forth in claim 1, 9 or 10, further comprising position detector means for detecting the arrival of the cutter blade at a predetermined position proximate to an upper surface of the film material,
   said position detector means including a slitted plate with a slit therein; and
   a light source and a light receiving element disposed on opposite sides of the slitted plate for detecting passage of the slit past the light source and for outputting a signal to the third moving means to slow the speed of the cutter blade by adjusting the magnitude of electrical power applied to said third moving means.

13. An apparatus as set forth in claim 9, wherein said rotation means includes:
   motor having a rotary shaft for rotating the supporting member by a desired angle;
   transmitting means for transmitting the driving force of the motor to the supporting member;
   a rotary encoder disposed on the rotary shaft of said motor;

an index provided on the supporting member and having an index line drawn thereon for rotating together with the supporting member;

an index detector provided opposite to said latex rotor for measuring the angle of the cutter blade; said index detector being electrically connected with computer means to output a position signal, on the basis of which the motor is controlled so as to turn the cutter blade to a esired cutting direction.

14. An automatic drawing apparatus with a cutter unit for automatically drawing an image on a film material comprising:

a table having a table surface for supporting thereon the film material;

a first carriage movable along the table surface in a first direction;

a second carriage mounted on and movable along the first carriage in a second direction;

first and second moving means for respectively moving the first and second carriages in the first and second directions, respectively;

drawing means on the second carriage and third moving means for moving the drawing means vertically relative to the film material for positioning the drawing means to draw a desired image on the film material; and cutter means provided adjacent to said drawing means and said third moving means being effective for moving the cutter means vertically relative to the film material and control means for selectively cutting the film material at first and second different cutting depths and means for selectively actuating said drawing means and said cutter means.

15. An apparatus as set forth in claim 14, further comprising memory means for storing image data including data relevant to film cutting; and processing means for processing said image data and for controlling the movements of the first and second carriages and either of said drawing means or said cutter means respectively in the first, the second and the vertical directions.

16. An apparatus as set forth in claim 15, wherein the image data relating to the line drawing includes a pressure command applicable to the drawing means, coordinate values of a line image and a function command for representing a drawing figure.

17. An apparatus as set forth in claim 15, wherein the image data relating to the film cutting includes a discrimination command for selectively cutting the film material to the first or second cutting depths, coordinate values for a contour image to be cut in the film material and a function command for representing a cutting figure.

18. An apparatus as set forth in claim 14, wherein said film material comprises a drawing sheet suitable for drawing a desired line image by said drawing means thereon.

19. An apparatus as set forth in claim 14, wherein said film material comprises an opaque layer for masking an undesired image and a transparent base layer for enabling a desired image pattern to be exposed therethrough.

20. An apparatus as set forth in claim 14, wherein said drawing means comprises:

a holder on the second carriage for holding a drawing pen thereon; and fourth moving means for moving the drawing pen in the vertical direction relative to the film material, said fourth moving means being movable between a first position where the drawing pen is spaced from the film material and a second position where the drawing pen is in contact with the film material in a position to draw thereon.

21. An apparatus as set forth in claim 14, wherein said cutter means comprises:

a cutter blade for cutting the film material;

a supporting member for holding said cutter blade at the lowermost part thereof;

rotation means for rotating said supporting member so as to turn the cutter blade to a desired cutting direction; and said third moving means being effective to selectively move said cutter blade to said first or second cutting depths.

22. An apparatus as set forth in claim 21, wherein said third moving means comprises:

biasing means on said supporting member for biasing the supporting member upward to raise the cutter blade above the film material; and linear motor means for moving the cutter blade downward to said first or second cutting depths in accordance with electrical power applied thereto.

23. An apparatus as set forth in claim 14 or 21, further comprising position detector means for detecting the arrival of the cutter blade at a predetermined position proximate to an upper surface of the film material, said position detector means including a slitted plate with a slit therein; and a light source and a light receiving element disposed on opposite sides of the slitted plate for detecting passage of the slit past the light source and for outputting a signal to said third moving means to slow the speed of the cutter blade by adjusting the magnitude of electrical power applied to said third moving means.

24. An apparatus for forming a mask film pattern on a film material, the apparatus comprising:

a table having a table surface for supporting thereon the film material;

cutter means for cutting the film material to form the mask film pattern therein;

moving means, coupled to the cutter means, for moving the cutter means in various directions parallel to the table surface and further for moving the cutter means generally perpendicular to the surface of the film material; and control means for selectively cutting the film material with the cutter means at first and second different cutting depths.

25. The apparatus of claim 24, wherein said cutter means is operable in conjunction with said control means for cutting the film material at said first cutting depth to form said mask film pattern and to cut said film material at said second cutting depth to form at least one positioning hole in said film material.

26. A method for automatically forming both a mask film pattern and at least one positioning hole on a film material, the method comprising the steps of:

providing a table having a table surface for supporting thereon said film material;

providing a cutter for cutting the film material for producing therein the mask film pattern and the at least one positioning hole; and moving the cutter in various directions parallel to the table surface and moving the cutter in a direction generally perpendicular to the surface of the film material and controlling moving of the cutter such as to selectively cut the film material at first and second different cutting depths for respectively forming said mask film pattern and said at least one positioning hole.

* * * * *